United States Patent [19]
Hirano

[11] Patent Number: 5,652,159
[45] Date of Patent: Jul. 29, 1997

[54] THIN FILM TRANSISTOR HAVING IMPROVED SWITCHING CHARACTERISTIC

[75] Inventor: Naoto Hirano, Tokyo, Japan

[73] Assignee: NEC Corporation, Japan

[21] Appl. No.: 548,559

[22] Filed: Oct. 26, 1995

[30] Foreign Application Priority Data

Oct. 27, 1994 [JP] Japan .................................. 6-263747

[51] Int. Cl.$^6$ ...................... H01L 21/265; H01L 21/44; H01L 21/48
[52] U.S. Cl. .......................... 437/41; 437/44; 437/192; 437/200
[58] Field of Search ................... 437/41 CS, 44, 437/192, 200

[56] References Cited

U.S. PATENT DOCUMENTS

| | | | |
|---|---|---|---|
| 3,707,765 | 1/1973 | Coleman | 29/578 |
| 4,190,850 | 2/1980 | Tihanyi et al. | 357/23 |
| 4,818,715 | 4/1989 | Chao | 437/44 |

FOREIGN PATENT DOCUMENTS

| | | |
|---|---|---|
| 3-4566 | 1/1991 | Japan . |
| 5-211166 | 8/1993 | Japan . |
| 6-326127 | 11/1994 | Japan . |

*Primary Examiner*—John Niebling
*Assistant Examiner*—Brian K. Dutton
*Attorney, Agent, or Firm*—Hayes, Soloway, Hennessey, Grossman & Hage, P.C.

[57] ABSTRACT

In a method of manufacturing a thin film transistor, a light shielding gate electrode is formed on a transparent insulating substrate. On the substrate including the gate electrode are laminated a gate insulating film, a semiconductor film, a protection insulating film, and a photoresist film. The photoresist film is patterned in alignment with the gate electrode. The protection insulating film is isotropically etched using the patterned photoresist film as a mask to have inclined portions. After the surface of the semiconductor film is rinsed to remove a natural oxide film, a metal film is deposited to form a metal silicide layer in alignment with the patterned protection insulating film. The metal film is patterned in such a manner that the metal portions are separated from the patterned protection insulating film. Next, ion implantation of impurity ions into the semiconductor film is performed using the first mask section as a mask such that the impurity ions pass through a part of the inclined portions and a part of the silicide layer, so that source and drain regions are formed to separate the metal silicide layer from a channel region to be formed under the patterned protection insulating film.

17 Claims, 15 Drawing Sheets

THIN FILM TRANSISTOR HAVING IMPROVED SWITCHING CHARACTERISTIC

BACKGROUND OF THE INVENTION

1. Field of the Invention

The present invention relates to a thin film transistor (TFT), and more particularly, to a thin film transistor in which a stable silicide layer is formed apart from a channel region.

2. Description of Related Art

The technique for forming as a switching element a thin film transistor (TFT) formed of silicon on a transparent insulating substrate such as a glass substrate is widely used in an active matrix type of liquid crystal device (LCD). Further, research and development of an LCD having high performance such as a large size high resolution LCD have proceeded flourishingly.

As one method for realizing such a high performance TFT is known a method disclosed in Japanese Laid Open Patent Disclosure (JP-A-Heise13-4566) in which the load of position aligning in a photo-lithography process is eliminated by use of self-alignment technique so that a channel length of the TFT can be shortened and a parasitic capacitance can be reduced. FIGS. 1A to 1F are cross sectional views of a TFT in the processes of a first conventional manufacturing method of the TFT.

First, as shown in FIG. 1A, a gate electrode 102 of a chromium (Cr) film is selectively formed on a glass substrate 101 and then a gate insulating film 103 of an amorphous silicon nitride film (to be referred to as "a-SiN film" hereinafter) is formed on the surface of the substrate including the gate electrode 102. On the gate insulating film 103 by plasma CVD method are sequentially laminated an i-type semiconductor film (to be referred to as "i-layer" hereinafter) 104 of an i-type amorphous silicon film (to be referred to as "a-Si film" hereinafter), a protection insulating film or a channel passivation film 105a of the a-SiN film having a low etching rate, and a protection insulating film 105b of the a-SiN film having an etching rate greater than that of the protection insulating film 105a. In this case, the thickness of the lower protection insulating film 105a is smaller than a projected range of impurity ions in an ion implantation process to be executed later. On the other hand, the film thickness of the upper protection insulating film 105b is sufficiently greater than the projected range of impurity ions. Subsequently, a positive type of photoresist film 106 is spin-coated on the protection insulating film 105b.

Next, as shown in FIG. 1B, the photoresist film 106 is exposed by light from the rear side of the glass substrate 101 using the gate electrode 102 as a photo-mask and then patterned in self-alignment with the gate electrode 102.

Next, as shown in FIG. 1C, the proteation insulating films 105b and 105a are sequentially dry-etched and patterned using the patterned photoresist film 106 as a mask.

Next, as shown in FIG. 1D, the patterned protection insulating films 105a and 105b are wet-etched in the state in which the patterned photoresist film 106 is remained using the difference between the protection insulating films 105a and 105b in etching rate such that the width of the upper protection insulating film 105b is smaller than that of the lower protection insulating film 105a.

Next, as shown in FIG. 1E, after the patterned photoresist film 106 is removed, phosphorus ions 110 are injected in the i-layer 104 by an ion implantation method using the protection insulating films 105a and 105b as a mask. As a result, an $n^+$-layer 111 is formed as source and drain regions in the i-layer 104. In this case, the source and drain regions extend to portions of the i-layer 104 below a part of the lower protection insulating film 105a exposed by removing or etching the upper protection insulating film 105b.

Next, as shown in FIG. 1F, a chromium (Cr) film is formed on the $n^+$-layer 111 by a sputtering method immediately after a natural oxide film formed on the n'-layer 111 is removed by diluted hydrofluoric acid solution. At this time, a Cr silicide layer 108 is formed at an interface using reaction between the Cr film and the n'-layer 111, ie., mutual diffusion. Subsequently, a part of the non-reaction Cr film is selectively etched so that source and drain electrodes are constituted of the remained Cr film 109 and the silicide layers 108.

As seen from the above description, the Cr silicide layer 108 is formed in the form buried in the $n^+$-layer 111. Therefore, there can be suppressed the degradation of hole blocking characteristic which degradation is caused by direct contact between the Cr silicide layer 108 and the channel region of the i-layer 104.

However, in this conventional example, since the dry etching of the protection insulating films 105a and 105b is anisotropic, the protection insulating films 105a and 105b are not etched so much so that the silicide layer directly contacts with the channel region. Further, a large amount of defects such as dangling bonds are also generated on the i-layer 104 surface after the ion implantation, i.e., the $n^+$layer 111 surface. As a result, the natural oxide film is formed on the surface in atmosphere with a very short time. The natural oxide film acts as a barrier layer which suppresses the reaction between the n'-layer 111 and the Cr film, so that the Cr silicide layer 108 is not entirely formed or formed to have resistivity. This results in remarkable reduction of the ON current of the TFT. Therefore, before the formation of the Cr film, it is essentially necessary to stabilize the i-layer surface by hydrogen atoms at the same time when the natural, oxide film is removed by the diluted hydrofluoric acid solution.

Even in this method, however, a new natural oxide film is formed with a short time after the hydrofluoric acid treatment because a very large amount of defects are present on the $n^+$-layer 111. Thus, the constraint that the Cr film must be formed speedily after the hydrofluoric acid treatment is remained in the manufacturing process. Further, the protection insulating films 105a and 105b having used as a mask in the ion implantation are damaged through the ion implantation to be readily etched. Accordingly, the width of the protection insulating films 105a and 105b is decreased narrower than the width between the $n^+$-layers 111, i.e., the channel region on the hydrofluoric acid treatment. As a result, the Cr silicide layers 108 formed in the subsequent process directly contact the channel region of the i-layer 104. This problem is often caused. This problem results in remarkable increase of the OFF current of the TFT so that the ratio of the ON and OFF currents of the TFT as a switching element is made small. In addition, there is another problem in that it is not allowed in the manufacturing process to make the i-layer 104 thin because the dry etching process patterning the protection insulating films 105a and 105b is interposed in the manufacturing process, so that over-etching of the lower i-layer 104 cannot be avoided.

The above problems cause degradation of reproducibility and reliability of the manufacturing process, and further degradation of a process margin. Therefore, another manufacturing process is needed to provide the TFT stably.

The other manufacturing process is disclosed in Japanese Laid Open Patent Disclosure (Jp-A-Heise5-211166), which improves the first conventional method. FIGS. 2A to 2E are cross sectional views of a TFT in the processes of a second conventional manufacturing method of the TFT.

First, as shown in FIG. 2A, a gate electrode 202 of a chromium (Cr) film is selectively formed on a glass substrate 201 and then a gate insulating film 203, the i-layer 204, and a first protection insulating film 214 having a high etching rate to hydrofluoric acid are sequentially laminated on the surface of the glass substrate 201 including the gate electrode 202 by a plasma CVD method. In this case, the first protection insulating film 214 has the film thickness sufficiently greater than the projected range of impurity ions in an ion implantation to be executed later. Next, a positive type of photoresist film 206 is spin-coated on the first protection insulating film 214. Subsequently, the photoresist film 206 is exposed by light from the rear side of the glass substrate 201 using the gate electrode 102 as a photo-mask and then patterned in self-alignment with the gate electrode 202. In this case, the rear exposure time and development time are adjusted in such a manner that the pattern width of the photoresist film 206 is made narrower than that of the gate electrode 202.

Next, as shown in FIG. 2B, the first protection insulating films 214 is dry-etched and patterned using the patterned photoresist film 206 as a mask.

Next, as shown in FIG. 2C, after the patterned photoresist film 206 is removed, phosphorus ions 210 are injected in the i-layer 204 by an ion implantation method using the first protection insulating film 214 as a mask. As a result, $n^+$-layers 111 are formed as source and drain regions.

Next, as shown in FIG. 2D, after the first protection insulating film 214 used as a mask in the ion implantation is quickly removed by hydrofluoric acid solution, a second protection insulating film 215 having low etching rate to hydrofluoric acid is formed on the surface including the $n^+$-layer 211 by using the plasma CVD method again. Then, a positive type of photoresist film 216 is spin-coated on the second protection insulating film 215, exposed from the rear side of the glass substrate 201 using the gate electrode 202 as a mask, and patterned in self-alignment with the gate electrode 202. In this process, the rear exposure time and development time are adjusted in such a manner that the pattern width of the photoresist film 216 is approximately equal to that of the gate electrode 202. Subsequently, the second protection insulating film 215 is patterned by a dry etching process using the patterned photoresist film 216 as a mask.

Next, as shown in FIG. 2E, after the photoresist film 216 is removed, a natural oxide film formed on the $n^+$-layer 211 is removed by diluted hydrofluoric acid solution. Thereafter, a Cr film is immediately formed by a sputtering method, so that a Cr silicide film 208 is formed at the interface between the $n^+$-layer 211 and the Cr film by use of the reaction of the $n^+$-layer 211 and the Cr film. Subsequently, a part of the non-reaction Cr film is selectively etched so that source and drain electrodes 209 composed of Cr film and the silicide layer are formed.

In the above second conventional method, two protection insulating films, i.e., the first protection insulating film 214 used in the ion implantation and the second protection insulating film 215 used in the formation of the Cr silicide layer 208 are separately and independently used. The $n^+$-layer 211 and the Cr silicide layer 208 are formed such that they are separated from each other, using the difference between the protection insulating films 214 and 215 in pattern width, Therefore, the problems in the first conventional manufacturing method are partially solved.

However, in the second conventional manufacturing method, there is a problem in that two processes for forming the protection insulating films 214 and 215 and two rear exposure processes for patterning are required so that the number of processes is increased. Further, since the pattern width of the first protection insulating film 214 is required to be narrow, the process margin is small. Therefore, it is difficult to apply this method to a method of manufacturing a TFT having a channel length shorter than 4 µm. In addition, since it is necessary that after the first protection insulating film 215 is once removed, the second protection insulating film 215 is newly formed, the i-layer 204 surface as an interface surface between the i-layer 204 and the protection insulating film 214 or 215 is exposed in the atmosphere or plasma during the formation of the insulating film. For this reason, the interface characteristic is degraded easily, resulting in degradation of TFT characteristics. Furthermore, when the Cr silicide layer 208 is formed after the ion implantation and dry etching, there is another problem in that it is difficult to always form the Cr silicide layer 208 having a low resistivity in a good state, because a natural oxide film is very quickly formed on the Cr silicide film 208. Also, since the patterning processes of the protection insulating films 214 and 215 by dry etching are necessary, there is still remained the problem in that the i-layer 204 cannot be made thin.

SUMMARY OF THE INVENTION

The present invention has, as an object, to provide a manufacturing method of a TFT having a silicide layer on an i-layer in a stable state with less damage.

Another object of the present invention is to provide a manufacturing method of a TFT in which the TFT has a short channel length and direct contact between the i-layer and the silicide layer is prevented.

Further another object of the present invention is to provide a more simplified method of a TFT than any conventional method.

Still another object of the present invention is to provide a thin film transistor manufactured by the above methods.

In order to achieve an aspect of the present invention, a thin film transistor includes a semiconductor film on a gate electrode formed on a transparent insulating substrate via a first insulating film, a second insulating film formed on tile semiconductor film above the gate electrode, source and drain electrodes each comprising a metal silicide layer formed in a surface portion of the semiconductor film and a metal portion apart from the second insulating film, and source and drain regions formed around a part of the silicide layer in the semiconductor film to separate the silicide layer from a channel region to be formed under the second insulating film.

In this case, a distance between the channel region and the metal silicide layer is longer than the thickness of the metal silicide layer and shorter than 0.5 µm. The shape of each of the source and drain regions is determined in accordance with the thickness of the metal silicide layer and the shape of the second insulating film. If the second insulating film includes a first insulating layer contacting the semiconductor film and a second insulting layer on the first insulating layer apart from end portions of the first insulating layer, the source and drain regions each have the region in a step manner.

In order to achieve another aspect of the present invention, a method of manufacturing a thin film transistor, includes the steps of:

forming a light shielding gate electrode on a transparent insulating substrate;

forming an insulating film on the substrate including the gate electrode;

forming a semiconductor film on the insulating film;

forming a first mask section having ifirst and second portions and provided on the semiconductor film above the gate electrode;

forming source and drain electrodes, each of said source and drain electrodes comprising a metal silicide layer formed in a surface portion of the semiconductor film and a metal portion apart from the first mask section; and performing ion implantation of ions impurity into the semiconductor film using the first mask section to form source and drain regions such that each of the source and drain regions is formed around a part of the silicide layer to separate the metal silicide layer from a channel region to be formed under the first mask portion section. In this case, the first mask section is formed in alignment with the gate electrode.

The first mask section is formed to have first and second portions. The first portion does not allow the impurity ions to pass through the first portion in the ion implantation step and the second portion allows the impurity ions to pass through the second portion. When the first mask portion is formed of a single film, the first portion of the first mask portion has a first thickness greater than a projected range of the impurity ions in the ion implantation step and the second portion of the first mask section has a second thickness smaller than the projected range of the impurity ions in the ion implantation step. In this case, the boundary between the first and second portion is present in the inclined portion.

Alternatively, when the first mask section is formed of a plurality of laminated films, an upper portion of the plurality of laminated films has a first thickness greater in total than a projected range of the impurity ions in the ion implantation step and has inclined portions in contact with the semiconductor film, if desirable. The remaining portion thereof has a second thickness smaller than the projected range of the impurity ions in the ion implantation step to thereby allow the impurity ions to pass through a part of the lower portion of the upper portion and the remaining portion, and the remaining portion thereof has the surface not contacting the upper portion. In this case, the boundary between the first and second portion is present in the upper portion.

The distance between the channel region and the metal silicide layer is longer than the thickness of the metal silicide layer and shorter than 50 nm.

The source and drain electrodes may be formed by rinsing the surface of the semiconductor film to remove a natural oxide film, depositing a metal film to form the metal silicide layer in alignment with the first mask section, and patterning the metal film to form metal portions. The first mask section may be formed by forming a protection insulating film on tile semiconductor film, forming a photoresist film on the protection insulating film, patterning the photoresist film in alignment with the gate electrode, and isotropically etching the protection insulating film using the patterned photoresist film using a mask. Alternatively, the first mask section may be formed by forming a first protection insulating film on the semiconductor film, forming a second protection insulating film on the first protection insulating film, the second protection film being thicker than the first protection insulating film and having an etching rate greater than that of the first protection insulating film, forming a photoresist film on the second protection insulating film, exposing from a rear side of the substrate and patterning the photoresist film using the gate electrode as a mask, isotropically etching the first and second protection insulating films using the patterned photoresist film using a mask, and removing the photoresist film. Further, the first mask section may be formed by forming a photoresist film on the semiconductor film, and exposing from a side of the substrate and patterning the photoresist film using the gate electrode as a mask. In addition, the first mask section may be formed by forming a protection insulating film on the semiconductor film, forming a first photoresist film on the protection insulating film, exposing from a rear side of the substrate and patterning the first photoresist film using the gate electrode as a mask, patterning the protection insulating film using the patterned first photoresist film using a mask, forming a second photoresist film on the protection insulating film, and patterning the second photoresist film such that the patterned second photoresist film exists on the patterned protection insulating film apart from end potions of the patterned protection insulating film.

DESCRIPTION OF THE PREFERRED EMBODIMENTS

Figure 1A:
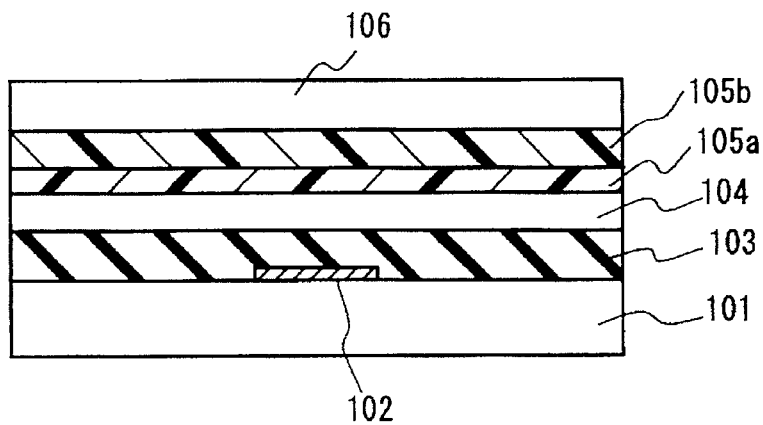
FIGS. 1A to 1F are cross sectional views of a TFT in a first conventional manufacturing method of the TFT.
Figure 1B:
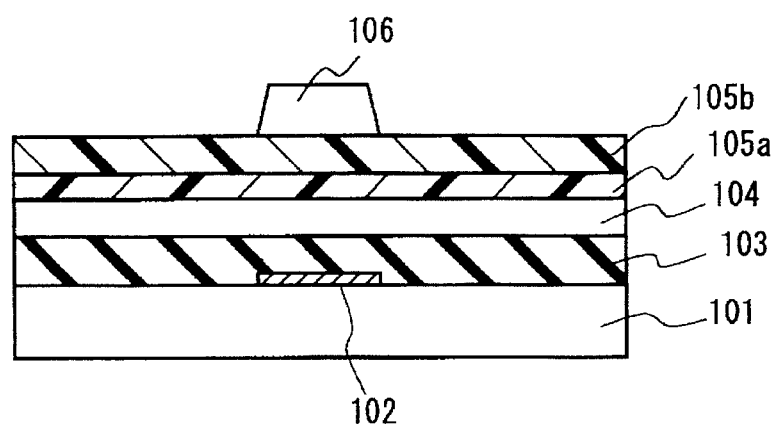
Figure 1C:
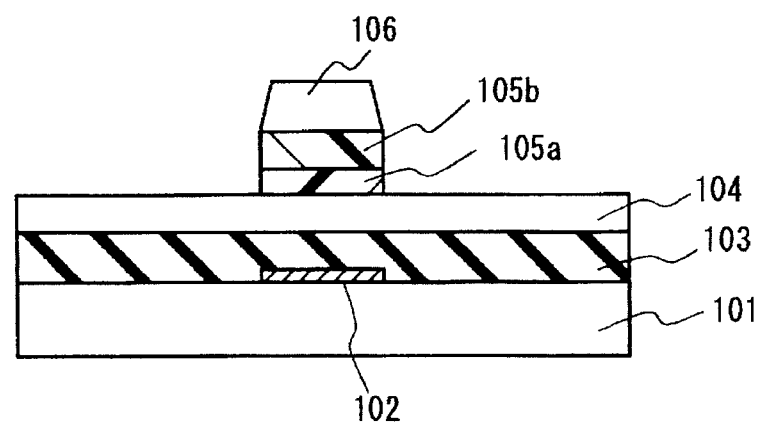
Figure 1D:
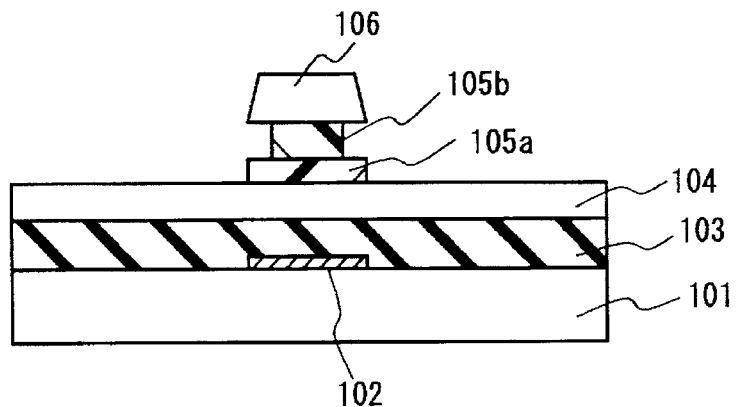
Figure 1E:
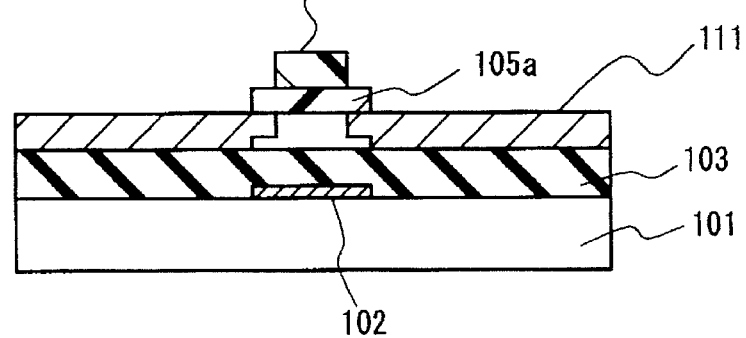
Figure 1F:
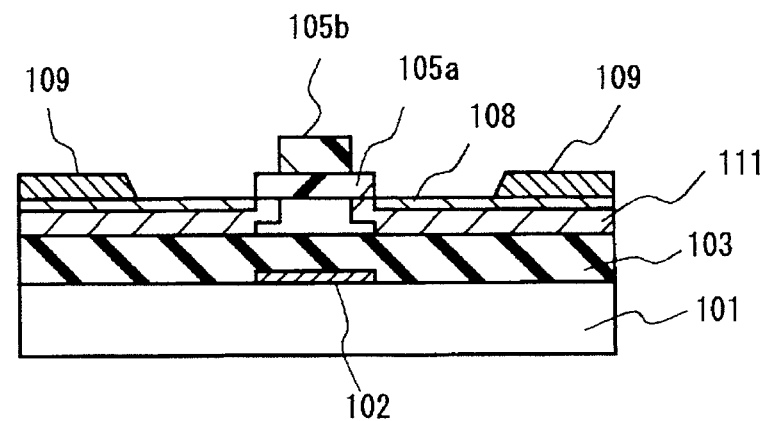
Figure 2A:
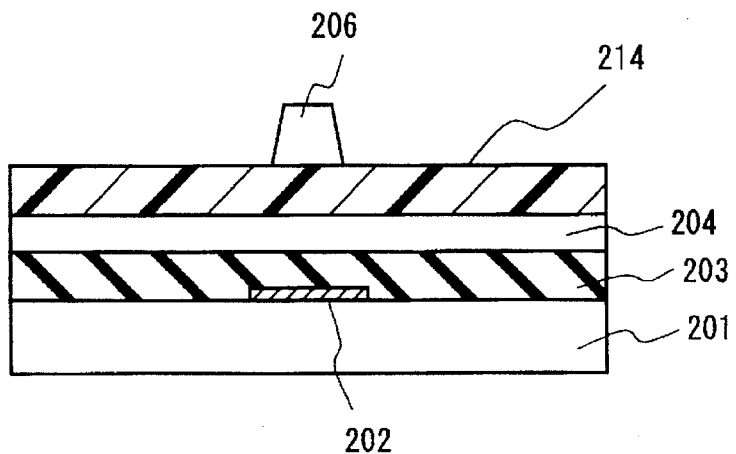
FIGS. 2A to 2E are cross sectional views of a TFT in a second conventional manufacturing method of the TFT.
Figure 2B:
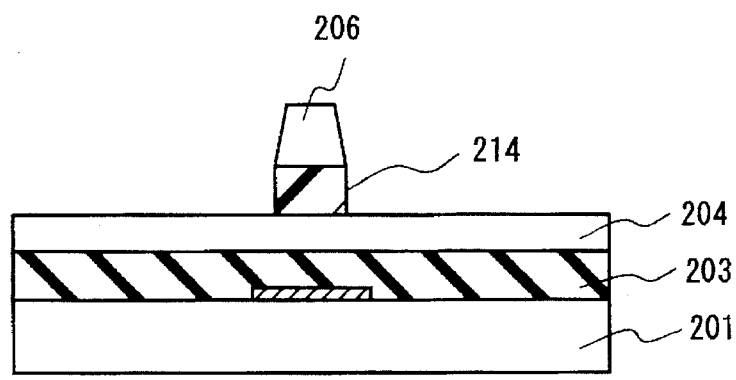
Figure 2C:
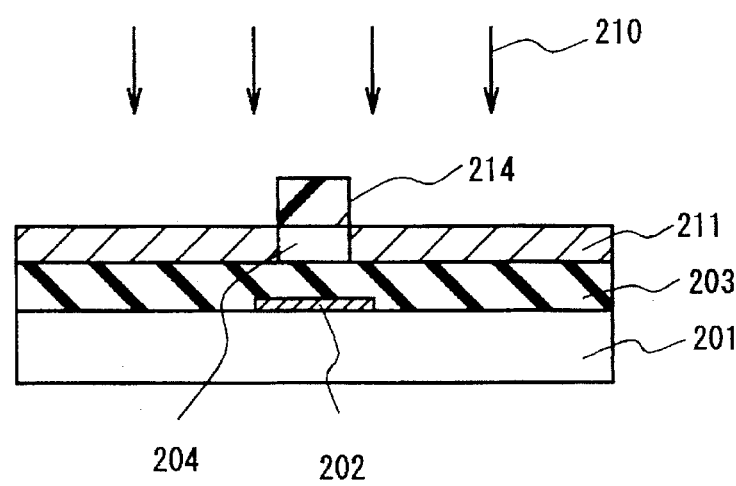
Figure 2D:
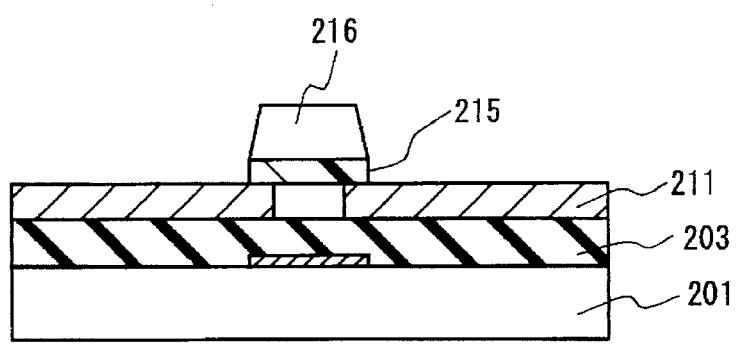
Figure 2E:
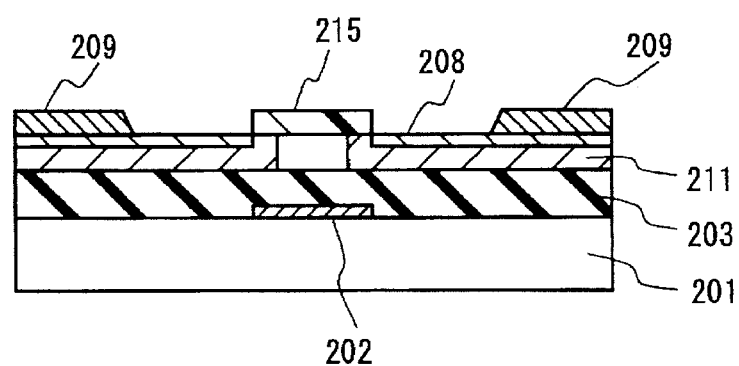

The manufacturing method of a thin film transistor (TFT) according to the present invention will be described below in detail with reference to the accompanying drawings. In the figures, the same or similar components are assigned with the same reference numerals.

Figure 3A:
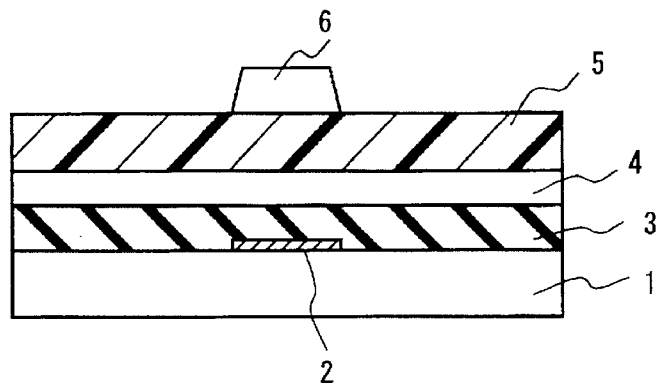
FIGS. 3A to 3D are cross sectional views of a TFT in a manufacturing method of the TFT according to a first embodiment of the present invention.
Figure 3B:
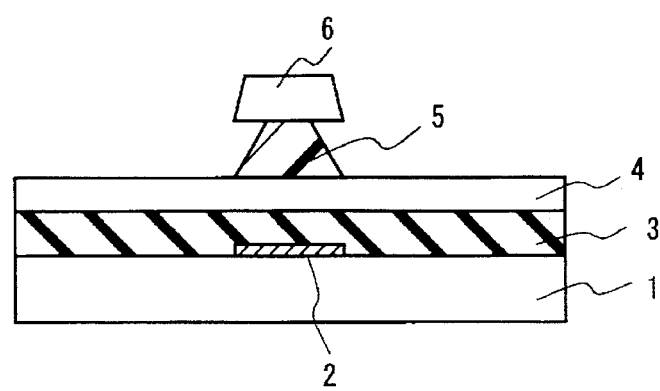
Figure 3C:
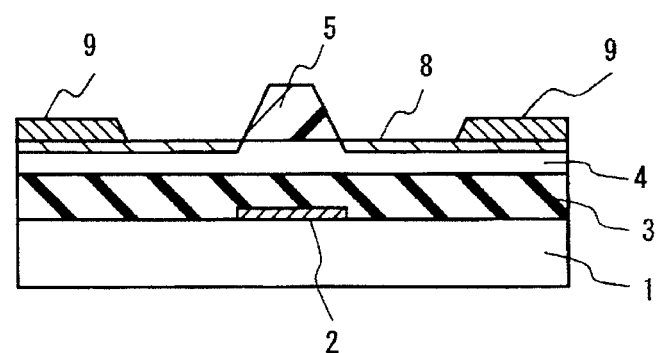
Figure 3D:
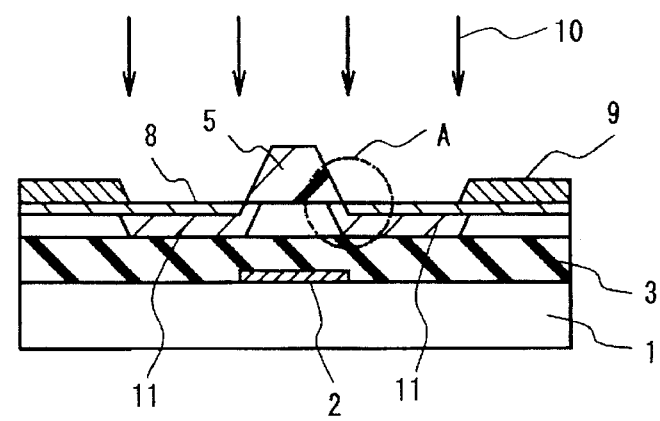
Figure 4:
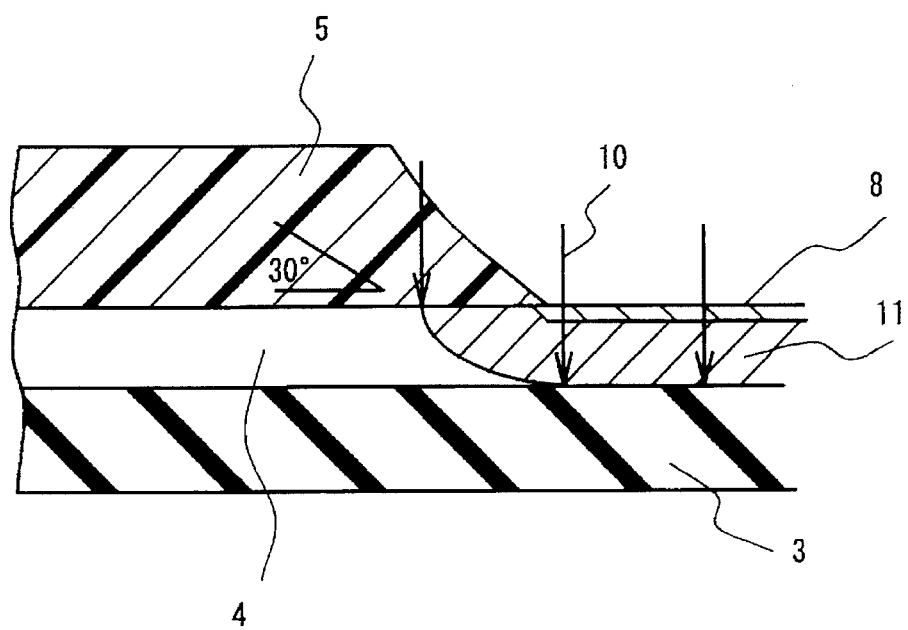
FIG. 4 is a partially expanded cross sectional view of the TFT shown in FIG. 3D by A in the manufacturing method of the TFT according to the first embodiment.

FIGS. 3A to 3D are cross sectional views of a TFT in a manufacturing method of the TFT according to the first embodiment of the present invention and FIG. 4 is a partially expanded cross sectional view of the TFT.

First, referring to FIG. 3A, a chromium (Cr) film of 100 nm in thick is formed on a glass substrate 1 by a sputtering method and patterned to form a gate electrode 2. Subsequently, on the surface of the substrate 1 including the gate electrode 2 by a plasma CVD method are sequentially formed and laminated a gate insulating film 3 of an amorphous silicon nitride film (to be referred to as "a-SiN film" hereinafter) of 300 nm in thick, an intrinsic semiconductor film (to be referred to as "i-layer" hereinafter) 4 of 50 nm in thick composed of an intrinsic amorphous silicon film (to be referred to as "i-type a-Si film" hereinafter), and a protection insulating film 5 of 150 nm in thick composed of the a-SiN film. Next, a positive type of photoresist film 6 of 1.5 μm in thick is spin-coated on the protection insulating film 5. Subsequently, the photoresist film 6 is exposed by light from the rear side of the glass substrate 1 using the gate electrode 2 as a photo-mask and then patterned in alignment with the gate electrode 2.

Next, as shown in FIG. 3B, the protection insulating films 5 is etched by hydrofluoric acid solution having concentration of 1% using the patterned photoresist film 6 as a mask. As a result, the end portions of the protection insulating film 5 each have an inclined portion due to isotropic etching which is peculiar to wet etching, as shown in FIG. 4. The inclined portion contacts the i-layer 4 with a sharp angle, e.g., of 30 degrees in this wet etching process.

Next, as shown in FIG. 3C, after the photoresist film 6 is removed, the substrate 1 is dipped in hydrofluoric acid solution having the concentration of 0.1% for about 15 sec. to remove a natural oxide film formed on the i-layer 4 surface. Then, a Cr film of 100 nm is deposited on the surface of the i-layer 4 surface including the protection insulating film 5 by a sputtering method. At this time, a Cr silicide layer 8 is formed at the interface between the i-layer 4 and the Cr film using mutual diffusion of the i-layer 4 and Cr film. Subsequently, a part of the non-reaction Cr film is patterned such that the Cr film is separated from the end portions of the Cr silicide layers 8 on the channel region side. The separated Cr films are used together with the Cr silicide film layer 8 to constitute source and drain electrodes 9 contacting source and drain regions to be formed later, respectively.

Next, as shown in FIG. 3D, phosphorus ions (P') 10 are injected by an ion implantation method using the protection insulating film 5 as a mask on the condition of an acceleration voltage of 20 KeV and a dose amount of $5 \times 10^{15}$ cm$^{-2}$. As a result, the source and drain regions composed of an n'-type amorphous silicon film (to be referred to as "n$^+$-layer" hereinafter) 11 are formed around the Cr silicide layers 8 in the i-layer 40 The projected range of phosphorus ions 10 in the a-SiN film under this condition is about 15.4 nm from the LSS theory and the distribution width is 6.5 nm. Therefore, the protection insulating film 5 having the thickness of 150 nm can fully block phosphorus ions 10. Further, since the Cr silicide layer 8 has the film thickness as thin as 3 to 5 nm, the Cr silicide layer 8 allows phosphorus ions 10 to pass through. Note that in a case of using of an ion doping method, i.e., a doping method using using hydrogen balanced phosphine gas as the ion source, the film thickness of the protection insulating film and implantation condition should be determined taking into account the projected range of ions such as hydrogen ions (H') other than phosphorus ions because the mass separation is not executed.

Since the protection insulating film 5 has inclined portions at the both ends, the inclined portion is thinner at a position closer to the end. Therefore, as shown in FIG. 4, phosphorus ions passes through a part of the inclined portion in the ion implantation to reach the i-layer 4 under the protection insulating film 5. Because the Cr silicide layer 8 is not formed in a portion of the i-layer 4 on the channel region side than the protection insulating film 5, the n$^+$-layer 11 can be formed even in a portion of the i-layer 4 close to the channel region than the end portion of the Cr silicide layer 8 without narrowing the width of the protection insulating film by hydrofluoric acid solution. As a result, the Cr silicide layer 8 can be prevented from directly contacting the channel region of the i-layer 4, resulting in realization of the good hole blocking characteristic. That is, in a conventional method, there was a problem in the reduction of the protection insulating film in a width direction through hydrofluoric acid treatment, because the ion implantation process, the hydrofluoric acid treatment, and the formation of silicide. On the other hand, since the silicide is formed after the hydrofluoric acid treatment, the pattern width of the protection insulating film for the channel region is not reduced. If it is reduced, there is no problem. The distance between the channel region and the Cr silicide layer 8 is desirably to be greater than the thickness of the Cr silicide layer 8, e.g., 3 to 5 nm in this example, and to be shorter than 0.5 μm. The distance corresponds to the portion of the protection insulating film 5 through which the impurity ions can pass.

Figure 6:
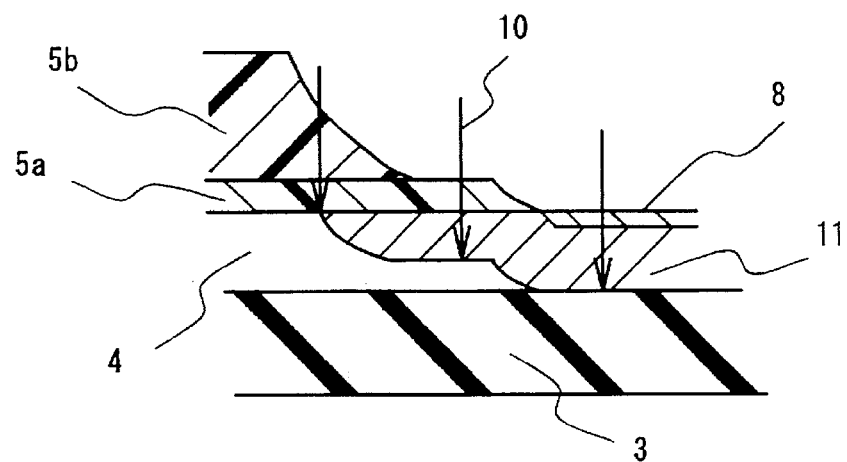
FIG. 6 is a partially expanded cross sectional view of the TFT shown in FIG. 5D by B in the manufacturing method of the TFT according to the second embodiment.

FIGS. 5A to 5D are cross sectional views of a TFT in a manufacturing method of the TFT according to the second embodiment of the present invention and FIG. 6 is a partially expanded cross sectional view of the TFT.

Figure 5A:
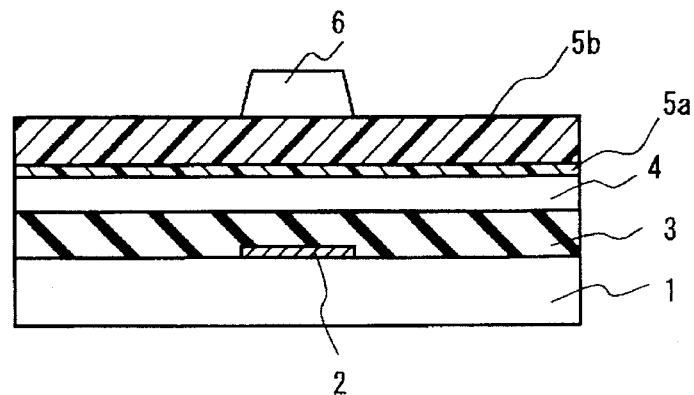
FIGS. 5A to 5D are cross sectional views of a TFT in a manufacturing method of the TFT according to a second embodiment of the present invention.
Figure 7:
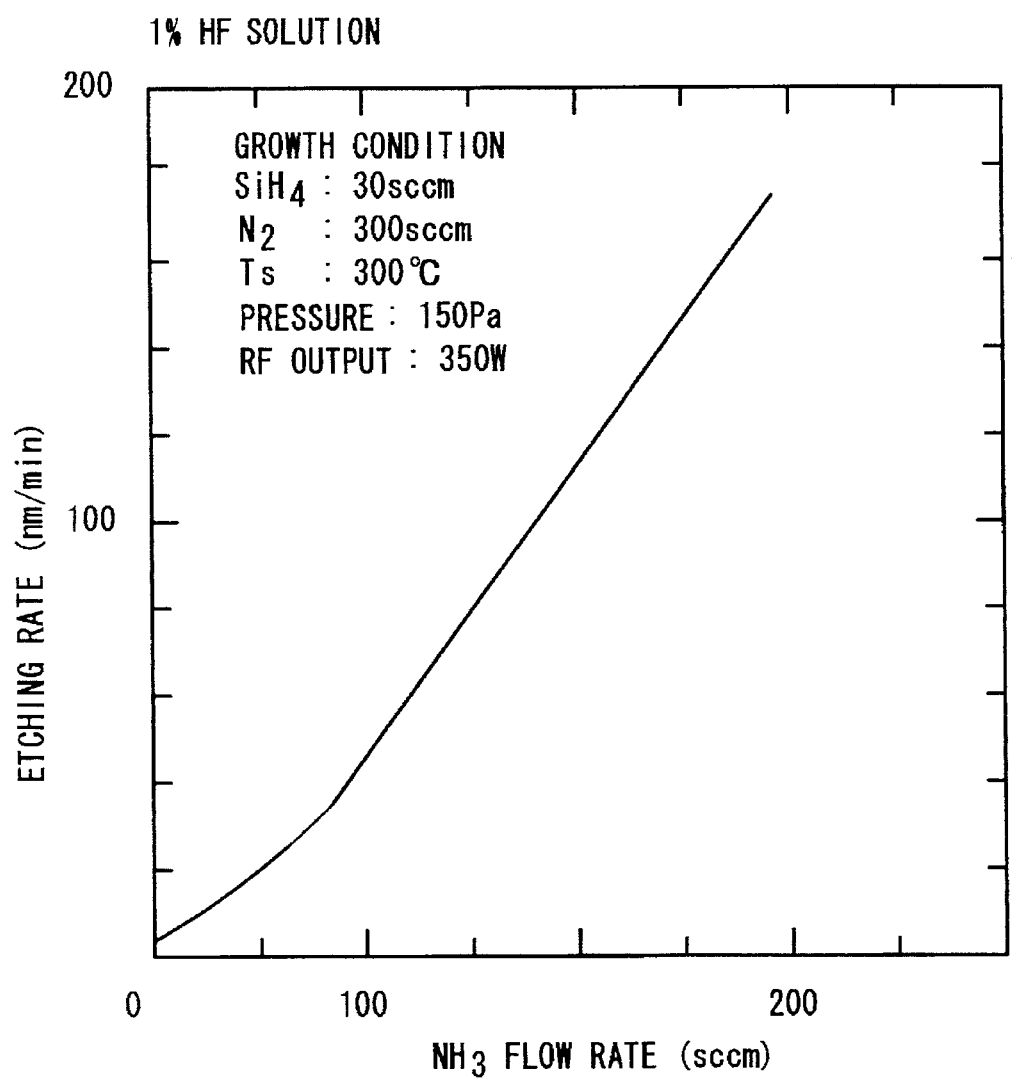
FIG. 7 is a graph showing a relation between $NH_3$ flow rate and etching rate in the formation of a protection insulating film.

First, referring to FIG. 5A, a chromium (Cr) film of 100 nm in thick is formed on a glass substrate 1 by a sputtering method and patterned to form a gate electrode 2, in the same manner as in the first embodiment. Subsequently, on the surface of the substrate 1 including the gate electrode 2 by a plasma CVD method are sequentially formed and laminated a gate insulating film 3 of 300 nm in thick, an i-layer 4 of 50 nm in thick, a protection insulating film 5a of 10 nm in thick having an etching rate of about 10 nm/min to 1% hydrofluoric acid solution, and a protection insulating film 5b of 140 nm in thick having an etching rate of about 50 nm/min to 1% hydrofluoric acid solution. The etching rates of the multi-layer protection insulating film 5a and 5b can be controlled by changing flow rate of ammonia (NH$_3$) in the film formation, as shown in FIG. 7. Note that the multi-layer protection insulating film is composed of two films 5a and 5b in the embodiment for simplification of description. However, three or more film may be used as the multi-layer protection insulating film. Next, a positive type of photoresist film 6 of 1.5 μm in thick is spin-coated on the upper protection insulating film 5b. Subsequently, the photoresist film 6 is exposed by light from the rear side of the glass substrate 1 using the gate electrode 2 as a photomask and then patterned in alignment with the gate electrode 2.

Figure 5B:
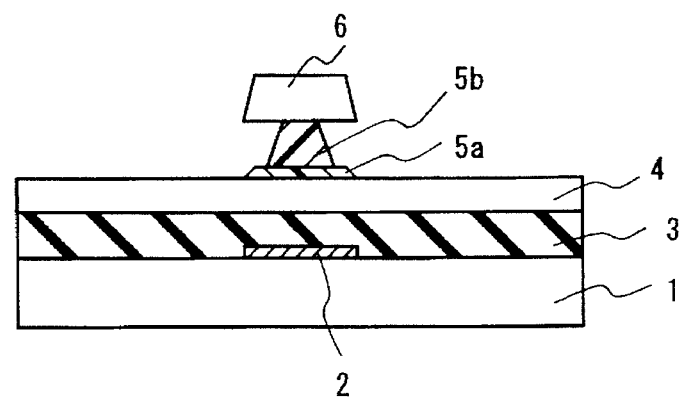

Next, as shown in FIG. 5B, the multi-layer protection insulating film 5a and 5b is etched by hydrofluoric acid solution having concentration of 1% using the patterned photoresist film 6 as a mask. As a result, the multi-layer protection insulating film 5a and 5b having a step structure is formed on the i-layer 4 because of the difference between the protection insulating films 5a and 5b in etching rate.

Figure 5C:
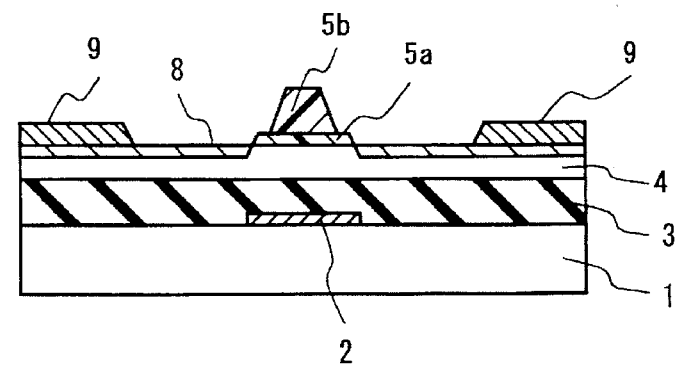
Figure 5D:
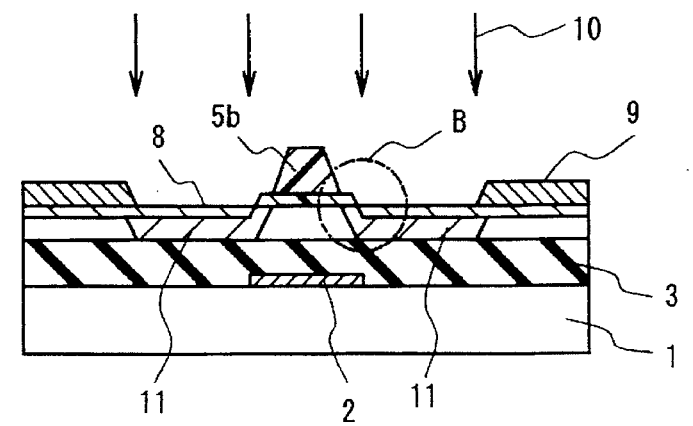

Next, as shown in FIG. 5C, the substrate 1 is dipped in hydrofluoric acid solution having the concentration of 0.1% for about 15 sec. to remove a natural oxide film formed on the i-layer 4 surface. Then, a Cr film of 100 nm is deposited on the surface of the entire surface of the substrate 1 by a sputtering method, such that Cr silicide layers 8 are formed at the interface between the i-layer 4 and the Cr film using reaction of the i-layer and Cr film. Subsequently, a part of the non-reaction Cr film is patterned and removed such that the Cr film is separated from the end portions of the Cr silicide layers 8 on the channel region side. The separated Cr films are used together with the Cr silicide layers 8 to constitute source and drain electrodes 9 contacting source and drain regions, respectively, Next, as shown in FIG. 5D, phosphorus ions ($P^+$) 10 are injected by an ion implantation method using the multi-layer protection insulating film 5$a$ and 5$b$ and source and drain electrodes 9 as masks on the condition of an acceleration voltage of 20 KeV and a dose amount of $5 \times 10^{15}$ cm$^{-2}$. As a result, the source and drain regions composed of an $n^+$-layer are formed around the Cr silicide layers 8 in the i-layer 4 in a step manner in correspondence to the etched multi-layer protection insulating film, as shown in FIG. 6. The phosphorus ions can pass through the protection insulation film 5$a$ having the film thickness of 10 nm to form the n'-layer 11 in the i-layer 4, because the film thickness of the lower protection insulating film 5$a$ is thinner than the projected range of about 15.4 nm of phosphorus ions 10.

In the second embodiment, as shown in FIG. 6, since the separation of between the end portion of the Cr silicide layers 8 and the end portion of the $n^+$-layer 11 is controlled by the film thickness of the lower protection insulating film 5$a$, the separation can be made controllably and reliably, resulting in further increasing of the hole blocking characteristic. Alternatively, the control is possible by not only the film thickness but also the etching rake.

Figure 8A:
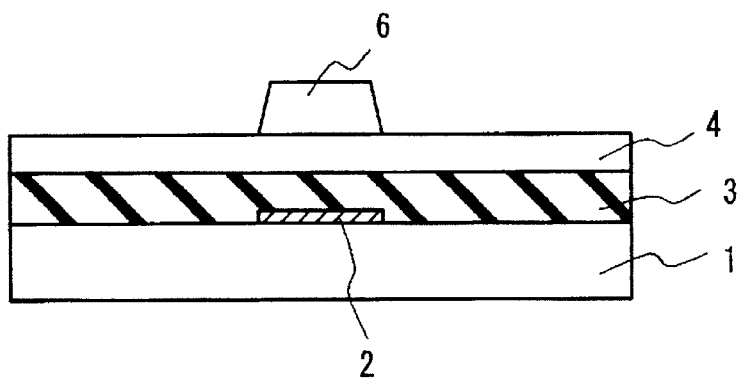
FIGS. 8A to 8D are cross sectional views of a TFT in a manufacturing method of the TFT according to a third embodiment of the present invention.
Figure 8B:
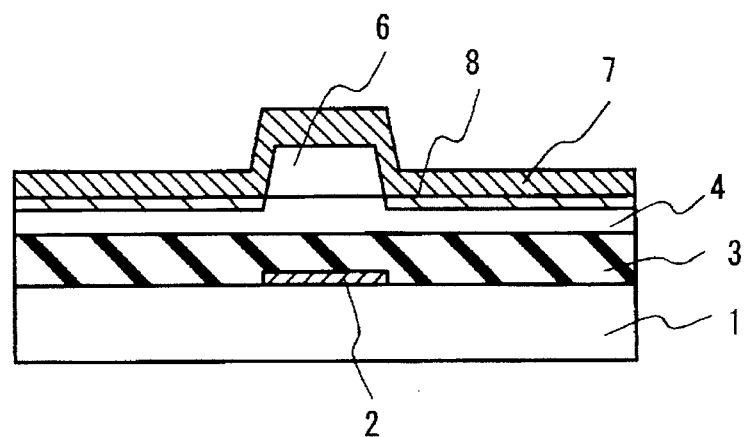
Figure 8C:
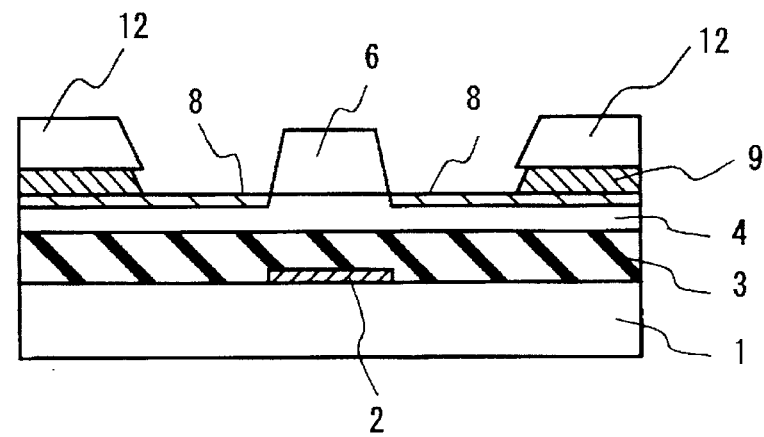
Figure 8D:
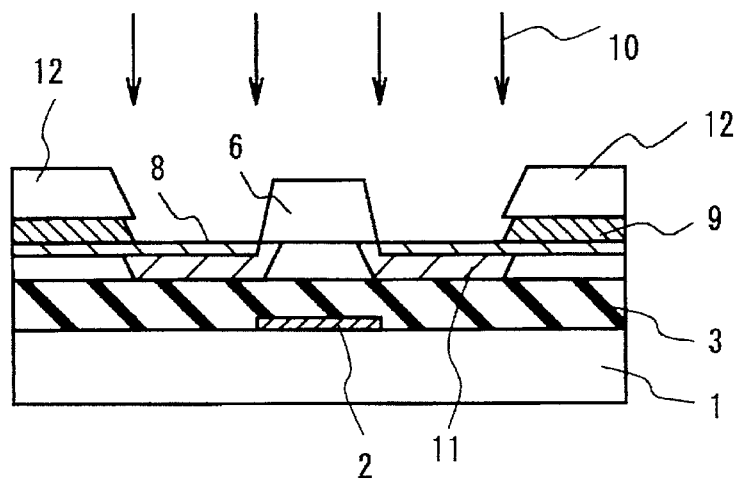
Figure 9:
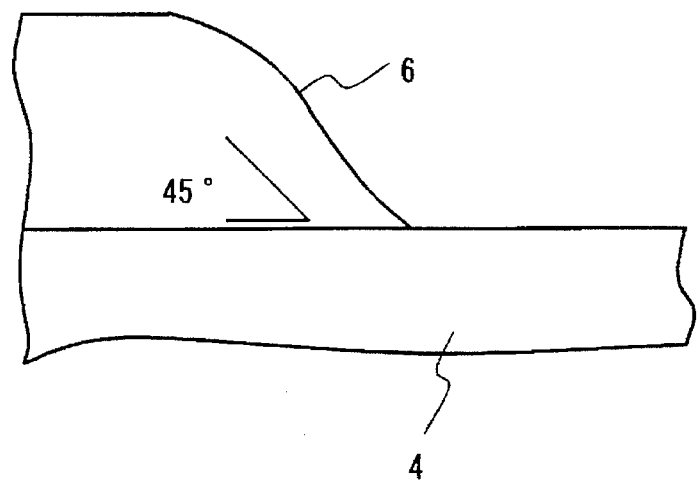
FIG. 9 is a partially expanded cross sectional view of the TFT in the manufacturing method of the TFT according to the third embodiment.

FIGS. 8A to 8D are cross sectional views of a TFT in a manufacturing method of the TFT according to the third embodiment of the present invention and FIG. 9 is a partially expended cross sectional view of a photoresist film.

First, referring to FIG. 8A, a chromium (Cr) film of 100 nm in thick is formed on a glass substrate 1 by a sputtering method and patterned to form a gate electrode 2, in the same manner as in the first embodiment. Subsequently, on the surface of the substrate 1 including the gate electrode 2 by a plasma CVD method are sequentially formed and laminated a gate insulating film 3 of 300 nm in thick, and an i-layer 4 of 50 nm in thick. Next, a positive type of photoresist film 6 of 1.5 μm in thick is spin-coated on the i-layer 4. Subsequently, the photoresist film 6 is exposed by light from the rear side of the glass substrate 1 using the gate electrode 2 as a photo-mask and then patterned in alignment with the gate electrode 2. In this case, by selecting the material and development condition of the photoresist film 6, the end portions of the photoresist film 6 can be inclined to contact the i-layer with a sharp angle, as shown in FIG. 9.

Next, as shown in FIG. 8B, the substrate 1 is dipped in hydrofluoric acid solution having the concentration of 0.1% for about 15 sec. in the state in which the patterned photoresist film 6 is remained, to remove a natural oxide film formed on tile i-layer 4 surface. Then, a Cr film 7 of 100 nm is deposited on the entire i-layer 4 surface including the patterned photoresist film 6 by a sputtering method, such that Cr silicide layers 8 are formed at the interface between the i-layer 4 and the Cr film 7 using reaction of the i-layer 4 and Cr film 7.

Next, as shown in FIG. 8C, a photoresist film 12 is coated and patterned on the Cr film 7. Subsequently, a part of the non-reaction Cr film 7 is etched using the patterned photoresist film 12 as a mask such that the Cr film is separated from the end portions of the Cr silicide layers 8 on the channel region side. The separated Cr films are used together with the Cr silicide layer 8 to constitute source and drain electrodes 9 contacting source and drain regions, respectively.

Next, as shown in FIG. 8D, phosphorus ions (P') 10 are injected in the i-layer 4 by an ion implantation method using the patterned photoresist films 6 and 12 as masks on the condition of an acceleration voltage of 20 KeV and a dose amount of $5 \times 10^{15}$ cm$^{-2}$. As a result, the source and drain regions composed of an $n^+$-layer 11 are formed around the Cr silicide layers 8 in the i-layer 4. The projected rage of phosphorus ions 10 into the photoresist film 6 is 86.6 nm from the LSS theory and the distribution width is 19.8 nm. Therefore, the photoresist film 6 having the film thickness of 1.5 μm can sufficiently prevent the phosphorus ions from passing through the film 6. Further, since the photoresist film 6 has inclined portions on the side walls as described already, it is possible to form the n'-layer 11 in a portion of the i-layer 4 under the inclined portions of the photoresist film 6, by use of the phosphorus ions 10 having passed through the inclined portions.

In the third embodiment, the manufacturing process can be more simplified than those in the first and second embodiment and increase of through-put and low cost can be also achieved. However, the channel region of the i-layer 4 is not continuously protected by any insulating film. Therefore, the interface is readily degraded and there is possibility that the TFT characteristic is degraded.

FIGS. 10A to 10E are cross sectional views of a TFT in a manufacturing method of the TFT according to the fourth embodiment of the present invention.

Figure 10A:
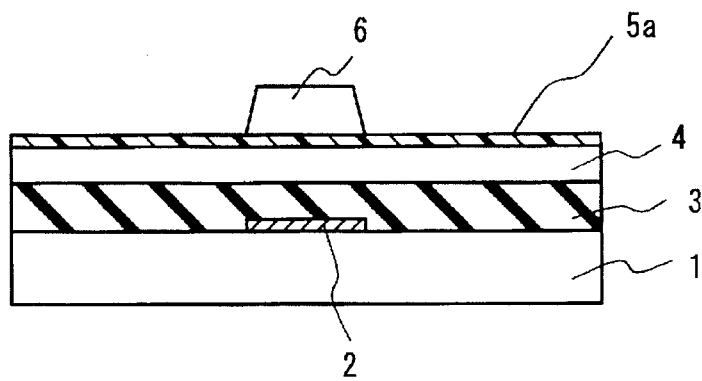
FIGS. 10A to 10E are cross sectional views of a TFT in a manufacturing method of the TFT according to a fourth embodiment of the present invention.

First, referring to FIG. 10A, a chromium (Cr) film of 100 nm in thick is formed on a glass substrate 1 by a sputtering method and patterned to form a gate electrode 2, in the same manner as in the first embodiment. Subsequently, on the surface of the substrate 1 including the gate electrode 2 by a plasma CVD method are sequentially formed and laminated a gate insulating film 3 of 300 nm in thick, an i-layer 4 of 50 nm in thick, and a protection insulating film 5$a$ of 10 nm in thick. Next, a positive type of photoresist film 6 of 1.5 μm in thick is spin-coated on the protection insulating film 5$b$. Subsequently, the photoresist film 6 is exposed by light from the rear side of the glass substrate 1 using the gate electrode 2 as a photo-mask and then patterned in alignment with the gate electrode 2.

Figure 10B:
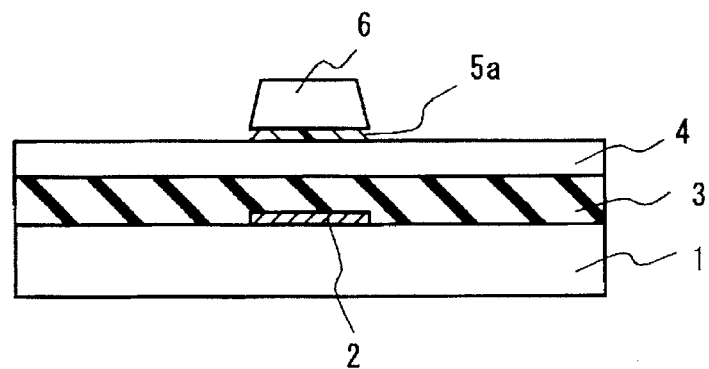

Next, as shown in FIG. 10B, the protection insulating film 5$a$ is etched by hydrofluoric acid solution having concentration of 1% using the patterned photoresist film 6 as a mask.

Figure 10C:
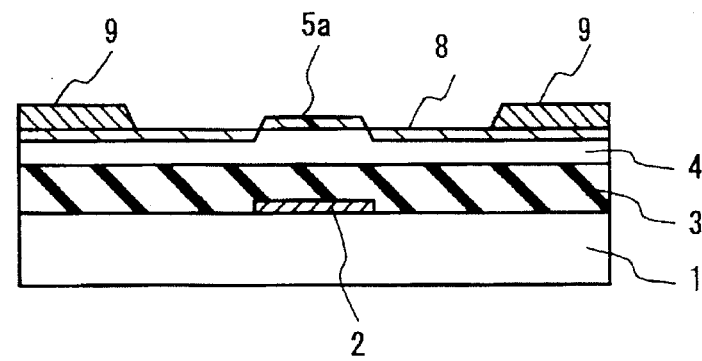

Next, as shown in FIG. 10C, after the photoresist film 6 is removed, the substrate 1 is dipped in hydrofluoric acid solution having the concentration of 0.1% for about 15 sec. to remove a natural oxide film formed on the i-layer 4 surface. Then, a Cr film of 100 nm is deposited on the entire surface of the substrate 1 by a sputtering method, such that Cr silicide layers 8 are formed at the interface between the i-layer 4 and the Cr film using reaction of the i-layer 4 and Cr film. Subsequently, a part of the non-reaction Cr film is patterned such that the Cr film is separated from the end portions of the Cr silicide layers 8 on the channel region side. The separated cr films are used together with the Cr silicide layers 8 to constitute source and drain electrodes 9 contacting source and drain regions, respectively.

Figure 10D:
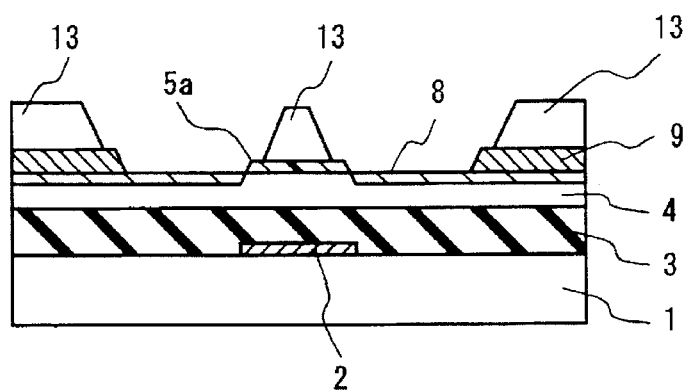

Next, as shown in FIG. 10D, a positive type of photoresist film 13 of 1.5 μm in thick is spin-coated on the entire surface of the substrate 1 including the protection insulating film 5a. Subsequently, the photoresist film 13 is exposed by light from the rear side of the glass substrate 1 using the gate electrode 2 as a photo-mask and then patterned in alignment with the gate electrode 2. In this case, the rear exposure time and the development time are taken longer than usual exposure and development times. As a result, the pattern width of the photoresist film 13 is made narrower than that of the protection insulating film 5a.

Figure 10E:
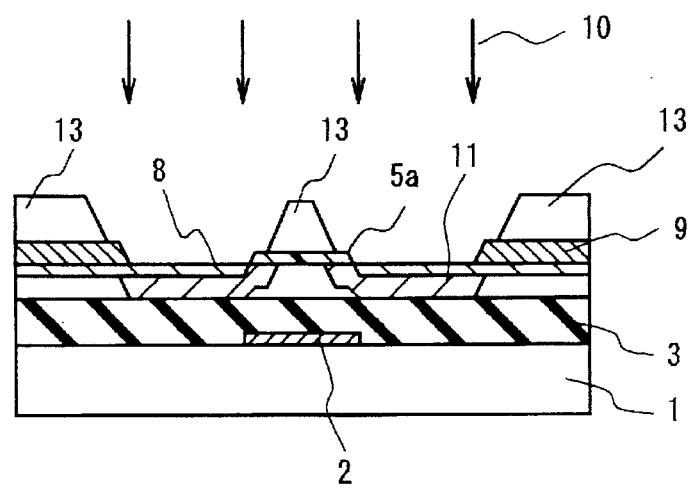

Next, as shown in FIG. 10E, phosphorus ions (P') 10 are injected by an ion implantation method using the photoresist film 13 as a mask on the condition of an acceleration voltage of 20 KeV and a dose amount of $5 \times 10^{15}$ cm$^{-2}$. As a result, the source and drain regions composed of an n$^+$-layer 11 are formed around the Cr silicide layers 8 in the i-layer 4. Since the film thickness of the protection insulating film 5a is smaller than the projected range of the phosphorus ions 10 and the film thickness of the photoresist film 13 is sufficiently greater than the projected range of the phosphorus ions 10, the n$^+$-layer 11 can be formed in a portion of the i-layer 4 under the protection insulating film 5a by use of the phosphorus ions 10 passing through only the protection insulating film 5a.

In the fourth embodiment, the degradation of TFT characteristics due to the degradation of interface between the i-layer and the protection insulating film, which is a problem in the third embodiment, can be prevented. Further, since the ion implantation is executed using the photoresist film 13 as a mask, it can be prevented that the protection insulating film 5a on the channel region is degraded through the impact of phosphorus ions 10, resulting in further increasing the TFT characteristics. However, there is still a problem on through-put in that two rear exposure processes are required.

FIGS. 11A to 11E are cross sectional views of a TFT in a manufacturing method of the TFT according to the fifth embodiment of the present invention.

Figure 11A:
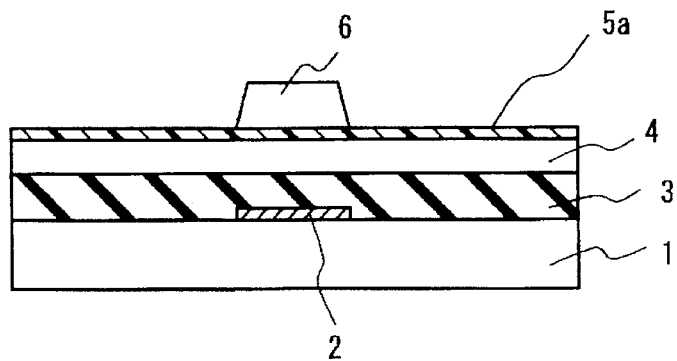
FIGS. 11A to 11E are cross sectional views of a TFT in a manufacturing method of the TFT according to a fifth embodiment of the present invention.

First, referring to FIG. 11A, a chromium (Cr) film of 100 nm in thick is formed on a glass substrate 1 by a sputtering method and patterned to form a gate electrode 2, in the same manner as in the first embodiment. Subsequently, on the surface of the substrate 1 including the gate electrode 2 by a plasma CVD method are sequentially formed and laminated a gate insulating film 3 of 300 nm in thick, and an i-layer 4 of 50 nm in thick, a protection insulating film 5a of 10 nm in thick. Next, a positive type of photoresist film 6 of 1.5 82 m in thick is spin-coated on the protection insulating film 5b. Subsequently, the photoresist film 6 is exposed by light from the rear side of the glass substrate 1 using the gate electrode 2 as a photo-mask and then patterned in alignment with the gate electrode 2.

Figure 11B:
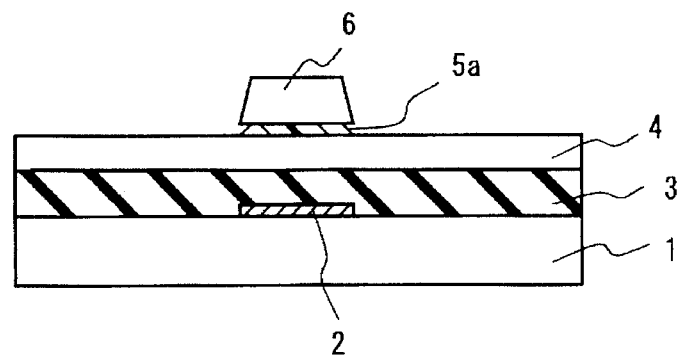

Next, as shown in FIG. 11B, the protection insulating film 5a is etched by hydrofluoric acid solution having concentration of 1% using the patterned photoresist film 6 as a mask.

Figure 11C:
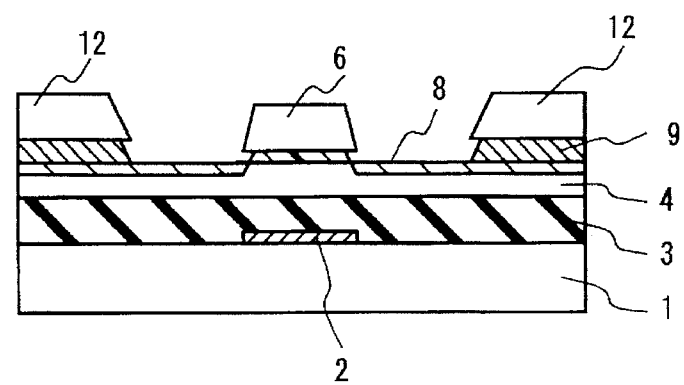

Next, as shown in FIG. 11C, the substrate 1 is dipped in hydrofluoric acid solution having tile concentration of 0.1% for about 15 sec. in the state in which the patterned photoresist film 6 is not sensitized, to remove a natural oxide film formed on the i-layer 4 surface. Then, a Cr film of 100 nm is deposited on the surface of the entire surface of the substrate 1 by a sputtering method or vapor deposition method, such that Cr silicide layers 8 are formed at the interface between the i-layer 4 and the Cr film using reaction of the i-layer and Cr film. The reason why the vapor deposition method may be used is that there is a possibility that the positive type of photoresist film 6 is sensitized by light emitted from argon (Ar) plasma which is generated in the sputtering method. However, it is possible to employ the sputtering method if the sputtering rate is sufficiently fast. Next, a photoresist film 12 is formed on the Cr film surface and patterned. The Cr film is selectively etched using the patterned photoresist films 12 so that the source and drain electrodes 9 composed of the Cr films remained as a part of electrodes contacting the source and drain regions are formed apart from the end portion of the Cr silicide layer 8 on the channel region side. In this case, the photoresist film 6 is left not being sensitized.

Figure 11D:
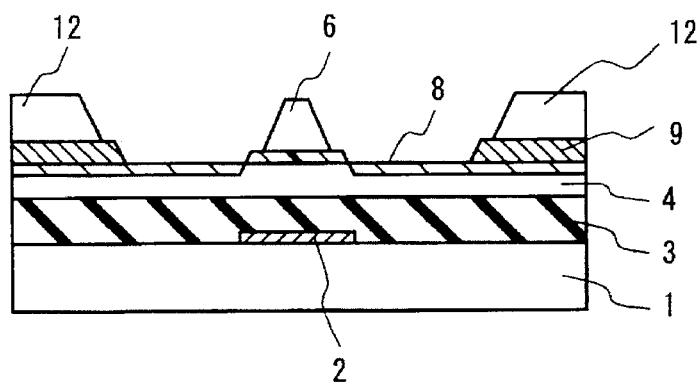

Next, as shown in FIG. 11D, the photoresist film 6 and the photoresist film 12 remaining on the protection insulating film 5a without sensitization are solved by a developing solution such that the pattern width of these photoresist films becomes narrower than the patten with of the protection insulating film 5a. In this case, although the photoresist film 6 is also solved in a direction of film thickness direction, there is caused no problem because the films have the sufficiently film thickness.

Figure 11E:
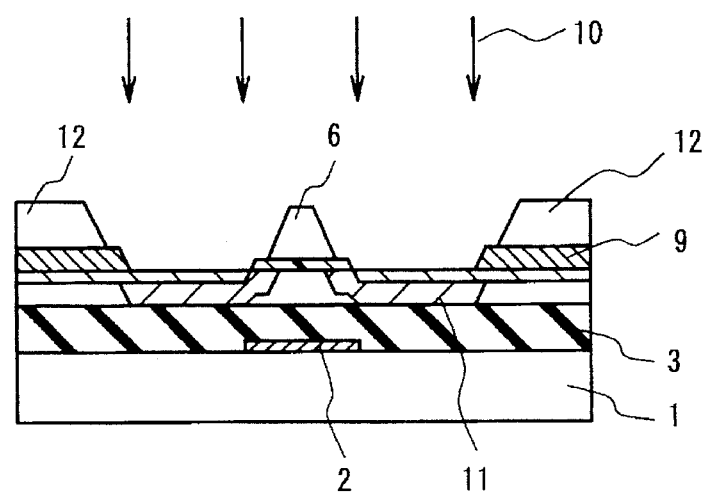

Next, as shown in FIG. 11E, phosphorus ions (P') 10 are injected by an ion implantation method using the photoresist film 6 as a mask on the condition of acceleration voltage of 20 KeV and a dose amount of $5 \times 10^{15}$ cm$^{-2}$. As a result, the source and drain regions composed of an n$^+$-layer 11 are formed around the Cr silicide layers 8 in the i-layer 4. Since the film thickness of the protection insulating film 5a is smaller than the projected range of the phosphorus ions 10 and the film thickness of the photoresist film 13 is sufficiently greater than the projected range of the phosphorus ions 10, the n$^+$-layer 11 can be formed in a portion of the i-layer 4 under the protection insulating film 5a by use of the phosphorus ions 10 passing through only the protection insulating film 5a.

In the fifth embodiment, one rear exposure process is only required and the through-put can be increased without the degradation of TFT characteristics.

Figure 12:
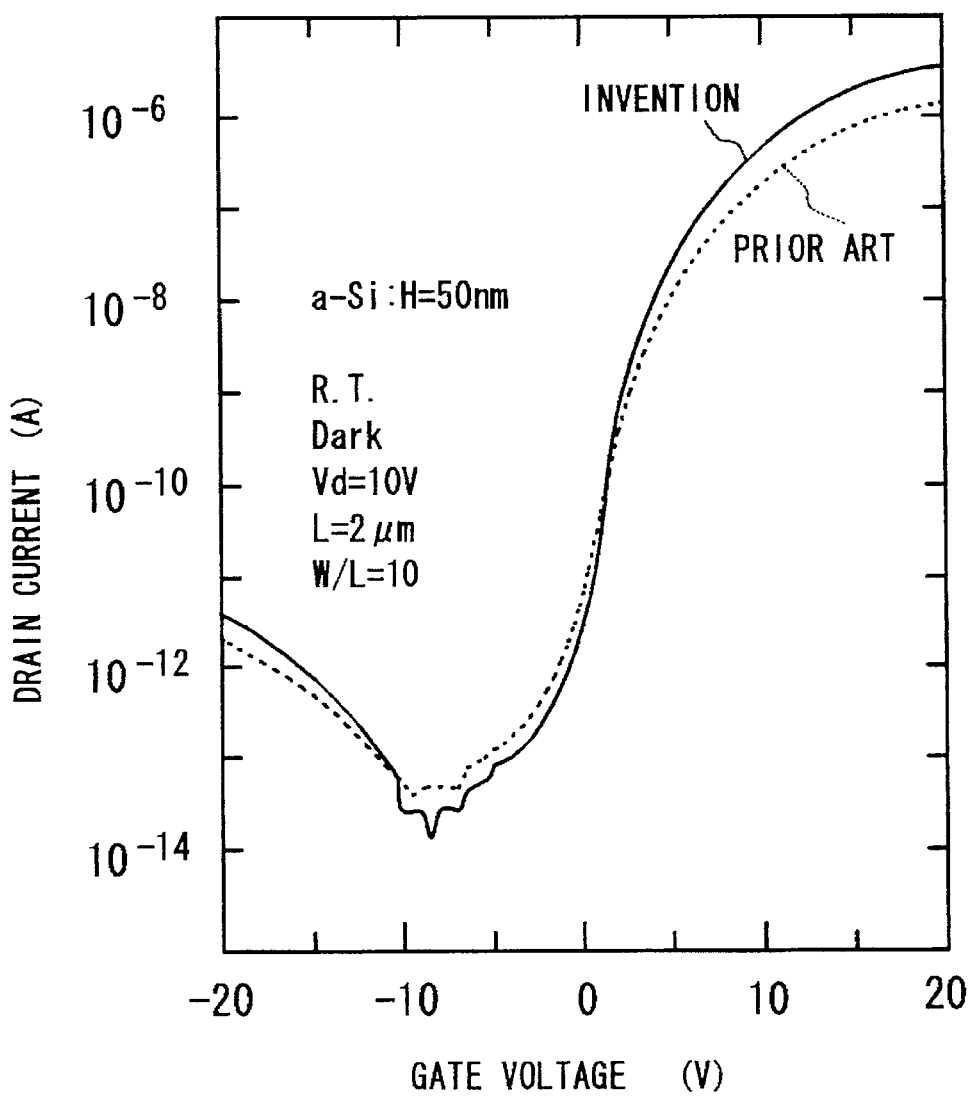
FIG. 12 is a graph showing gate voltage—drain current characteristics of the TFT manufactured in accordance with the manufacturing method of the present invention and TFT manufactured in accordance with the conventional manufacturing method.

FIG. 12 is a graph showing the gate voltage (Vg) vs drain current (Id) characteristics of the TFT manufactured according to the present invention and TFT manufactured in accordance with the conventional method. As seen from the figure, in the present invention, even if the TFT has a short channel length of 2 μm, the TFT can be manufactured with good reproducibility and uniformity. Further, the ON current is increased twice compared to that of the conventional TFT in the good state in which the OFF current is the same as that of the conventional TFT.

As described above, according to the present invention, after the silicide layer used to a part of the source and drain electrodes is formed, ion implantation or ion doping is executed using as a mask the protection insulating film or the photoresist film which is formed in alignment with the gate electrode. In the ion injection, the source and drain regions are formed by use of the impurity ions passing through the thinly inclined portions of tile thick protection insulating film or thick photoresist film, or thin protection insulating film. Therefore, the source and drain regions can be formed in the portion of the i-layer 4 close to the channel region than the silicide layer with good reproducibility. As a result, the silicide layer does not direct contact the channel region, so that increase of the OFF current can be prevented.

Further, since the natural oxide film removing process using diluted hydrofluoric acid solution is performed to the stable i-layer with less defect, it is possible to maintain the stable surface of the i-layer for a long time. Therefore, the process margin can be further increased. Also, since the manufacturing method is not influenced by a distribution of film thicknesses, a large amount of TFTs having a short channel of 2 μm or below can be always formed uniformly.

In addition, since the silicide film is formed on the stable i-layer surface, the silicide film has a good property.

Also, since the reducing process of the protection insulating film by the hydrofluoric acid solution is not required unlike the method (JP-A-Heisei5-211166), film peeling can be prevented so that the production yield can be increased and the down of the ON current of the TFT can be also prevented. Further, films of various materials may be formed on the i-layer as the protection insulating films in spite of the etching rate ratio of the silicide layer and the protection insulating film. Furthermore, the method is simplified, compared to the technique disclosed in JP-A-Heisei6-326127.

Furthermore, in a case where the manufacturing method of the TFT according to the present invention is applied to an active matrix type LCD (AMLCD), since the protection insulating film can be formed to have a thin structure or an inclined step structure, it can be prevented that the drain wiring is broken at the protection insulating film portion.

What is claimed is:

1. method of manufacturing a thin film transistor, comprising the steps of:

forming a light shielding gate electrode on a transparent insulating substrate;

forming an insulating film on said substrate including said gate electrode;

forming a semiconductor film on said insulating film;

forming a first mask section having first and second portions and provided on said semiconductor film above said gate electrode;

forming source and drain electrodes, each of said source and drain electrodes comprising a metal silicide layer formed in a surface portion of said semiconductor film and a metal portion apart from said first mask section; and performing ion implantation of impurity ions into said semiconductor film using said first mask section to form source and drain regions such that each of said source and drain regions is formed around a part of said metal silicide layer to separate said metal silicide layer from a channel region to be formed under said first mask section.

2. The method according to claim 1, wherein said step of forming a first mask section includes forming said first mask section in alignment with said gate electrode.

3. The method according to claim 1, wherein said first portion does not allow the impurity ions to pass through said first portion in the step of performing ion implantation and said second portion allows the impurity ions to pass through said second portion.

4. The method according to claim 3, wherein said first mask portion is formed of a single film, and said first portion of said first mask section has a first thickness greater than a projected range of the impurity ions in the step of performing ion implantation and said second portion of said first mask section has a second thickness smaller than the projected range of the impurity ions in the step of performing ion implantation.

5. The method according to claim 3, wherein said first mask section is formed of a plurality of laminated films, and an upper portion of the plurality of laminated films as said first portion has a first thickness greater in total than a projected range of the impurity ions in the step of performing ion implantation a remaining portion of the plurality of laminated films other than said upper portion as said second portion has a second thickness smaller than the projected range of the impurity ions in the step of performing ion implantation such that the impurity ions are allowed to pass through a part of the upper portion and said remaining portion, and said remaining portion has the surface not contacting said upper portion.

6. The method according to claim 1, wherein a distance between said channel region and said metal silicide layer is longer than the thickness of said metal silicide layer and shorter than 0.5 μm.

7. The method according to claim 1, wherein said step of forming source and drain electrodes includes:

rinsing the surface of said semiconductor film to remove a natural oxide film;

depositing a metal film to form said metal silicide layer in alignment with said first mask section;

patterning said metal film to form metal portions.

8. The method according to claim 1, wherein said step of forming a first mask section includes:

forming a protection insulating film on said semiconductor film;

forming a photoresist film on said protection insulating film;

patterning said photoresist film in alignment with said gate electrode to form a patterned photoresist film; and isotropically etching said protection insulating film using said patterned photoresist film as a mask to form said first mask section having said first and second portions inclined.

9. The method according to claim 1, wherein said step of forming a first mask section includes:

forming a first protection insulating film on said semiconductor film;

forming a second protection insulating film on said first protection insulating film, said second protection film being thicker than said first protection insulating film so as not to allow said impurity ions to pass said second protection film and having an etching rate greater than that of said first protection insulating film;

forming a photoresist film on said second protection insulating film;

exposing from a rear side of said substrate and patterning said photoresist film using said gate electrode as a mask to form a patterned photoresist film;

isotropically etching said first and second protection insulating films using said patterned photoresist film as a mask; and removing said patterned photoresist film.

10. The method according to claim 1, wherein said step of forming a first mask section includes:

forming a photoresist film on said semiconductor film; and exposing from a side of said substrate and patterning said photoresist film using said gate electrode as a mask to form said first mask section having said first and second portions inclined.

11. The method according to claim 1, wherein said step of forming a first mask section includes:

forming a protection insulating film on said semiconductor film;

forming a first photoresist film on said protection insulating film;

exposing from a rear side of said substrate and patterning said first photoresist film using said gate electrode as a mask to form a patterned first photoresist film;

patterning said protection insulating film using said patterned first photoresist film as a mask to form a patterned protection insulating film;

removing said patterned first photoresist film after forming said source and drain electrodes;

forming a second photoresist film; and patterning said second photoresist film to form a patterned second photoresist film on said patterned protection insulating film apart from end portions of said patterned protection insulating film.

12. The method according to claim 1, wherein said step of forming a first mask section includes:

forming a protection insulating film on said semiconductor film;

forming a photoresist film on said protection insulating film;

exposing from a rear side of said substrate and patterning said photoresist film using said gate electrode as a mask to form a patterned photoresist film;

patterning said protection insulating film using said patterned photoresist film as a mask to form a patterned protection insulating film; and after forming said source and drain electrodes, patterning said patterned photoresist film to form a patterned photoresist film on said patterned protection insulating film apart from end portions of said patterned protection insulating film.

13. A method of manufacturing a thin film transistor, comprising the steps of:

forming a light shielding gate electrode on a transparent insulating substrate;

forming an insulating film on said substrate including said gate electrode;

forming a semiconductor film on said insulating film;

forming a protection insulating film on said semiconductor film;

forming a photoresist film on said protection insulating film;

patterning said photoresist film in alignment with said gate electrode to form a patterned photoresist film;

isotropically etching said protection insulating film using said patterned photoresist film as a mask to form a patterned protection insulating film having inclined portions;

rinsing the surface of said semiconductor film to remove a natural oxide film;

depositing a metal film to form said metal silicide layer in alignment with said patterned protection insulating film;

patterning said metal film such that said metal portions are separated from said patterned protection insulating film; and executing ion implantation of impurity ions into said semiconductor film using a part of said patterned protection insulating film as a mask such that the impurity ions pass through a part of the inclined portions and a part of said metal silicide layer, so that source and drain regions are formed to separate said metal silicide layer from a channel region to be formed under said patterned protection insulating film.

14. A method of manufacturing a thin film transistor, comprising the steps of:

forming a light shielding gate electrode on a transparent insulating substrate;

forming an insulating film on said substrate including said gate electrode;

forming a semiconductor film on said insulating film;

forming a first protection insulating film on said semiconductor film;

forming a second protection insulating film on said first protection insulating film, said second protection film being thicker than said first protection insulating film and having an etching rate greater than that of said first protection insulating film;

forming a photoresist film on said second protection insulating film;

exposing from a rear side of said substrate and patterning said photoresist film using said gate electrode as a mask to form a patterned photoresist film;

isotropically etching said first and second protection insulating films using said patterned photoresist film as a mask to form patterned first and second protection insulating films;

removing said patterned photoresist film;

rinsing the surface of said semiconductor film to remove a natural oxide film;

depositing a metal film to form said metal silicide layer in alignment with said patterned first and second protection insulating films;

patterning said metal film to form metal portions separated from said patterned first and second protection insulating films; and executing ion implantation of impurity ions into said semiconductor film using said patterned second protection insulating film as a mask such that the impurity ions pass through said patterned first protection insulating film and a part of said metal silicide layer, so that source and drain regions are formed to separate said metal silicide layer from a channel region to be formed under said patterned first protection insulating film.

15. A method of manufacturing a thin film transistor, comprising the steps of:

forming a light shielding gate electrode on a transparent insulating substrate;

forming an insulating film on said substrate including said gate electrode;

forming a semiconductor film on said insulating film;

forming a photoresist film on said semiconductor film;

patterning said photoresist film in alignment with said gate electrode to form a patterned photoresist film having inclined portions;

rinsing the surface of said semiconductor film to remove a natural oxide film;

depositing a metal film to form said metal silicide layer in alignment with said patterned photoresist film;

patterning said metal film to form metal portions separated from said patterned photoresist film; and executing ion implantation of impurity ions into said semiconductor film using a part of said patterned photoresist film as a mask such that the impurity ions pass through a part of the inclined portions and a part of said metal silicide layer, so that source and drain regions are formed to separate said metal silicide layer from a channel region to be formed under said patterned photoresist film.

16. A method of manufacturing a thin film transistor, comprising the steps forming a light shielding gate electrode on a transparent insulating substrate;

forming an insulating film on said substrate including said gate electrode;

forming a semiconductor film on said insulating film;

forming a protection insulating film on said semiconductor film;

forming a first photoresist film on said protection insulating film;

patterning said first photoresist film in alignment with said gate electrode to form a patterned first photoresist film;

patterning said protection insulating film using said patterned first photoresist film as a mask to form a patterned protection insulating film;

rinsing the surface of said semiconductor film to remove a natural oxide film;

depositing a metal film to form said metal silicide layer in alignment with said patterned protection insulating film;

patterning said metal film to form metal portions separated from said patterned protection insulating film;

after removing said patterned first photoresist film, forming a second photoresist film on said patterned protection insulating film;

exposing and patterning said second photoresist film to form a patterned second photoresist film on said patterned protection insulating film apart from end portions of said patterned protection insulating film; and executing ion implantation of impurity ions into said semiconductor film using a part of said patterned second photoresist film as a mask such that the impurity ions pass through a part of said patterned protection insulating film and a part of said metal silicide layer, so that source and drain regions are formed to separate said metalsilicide layer from a channel region to be formed under said patterned protection insulating film.

17. A method of manufacturing a thin film transistor, comprising the steps of:

forming a light shielding gate electrode on a transparent insulating substrate;

forming an insulating film on said substrate including said gate electrode;

forming a semiconductor film on said insulating film;

forming a protection insulating film on said semiconductor film;

forming a photoresist film on said protection insulating film;

patterning said photoresist film in alignment with said gate electrode to form a patterned photoresist film; and patterning said protection insulating film using said patterned photoresist film as a mask to form a patterned protection insulating film;

rinsing the surface of said semiconductor film to remove a natural oxide film;

depositing a metal film to form said metal silicide layer in alignment with said patterned protection insulating film;

patterning said metal film to form metal portions separated from said patterned protection insulating film;

reducing said photoresist film to form a reduced photoresist film on said patterned protection insulating film apart from end portions of said patterned protection insulating film to have inclined portions; and executing ion implantation of impurity ions into said semiconductor film using a part of said patterned photoresist film as a mask such that the impurity ions pass through a part of said patterned protection insulating film and a part of said metal silicide layer, so that source and drain regions are formed to separate said metal silicide layer from a channel region to be formed under said patterned protection insulating film.

* * * * *

UNITED STATES PATENT AND TRADEMARK OFFICE
CERTIFICATE OF CORRECTION

PATENT NO. : 5,652,159
DATED : July 29, 1997
INVENTOR(S) : Naoto Hirano

It is certified that error appears in the above-indentified patent and that said Letters Patent is hereby corrected as shown below:

Claim 1, Col. 13, line 26, insert -- A -- before "method"

Claim 16, Col. 17, line 6, after "steps" insert -- of: --

Claim 16, Col. 18, line 2, change "metalsilicide" to read -- metal silicide --

Signed and Sealed this

Twenty-third Day of June, 1998

Attest:

BRUCE LEHMAN

Attesting Officer

Commissioner of Patents and Trademarks